United States Patent
Wang et al.

(10) Patent No.: US 10,574,205 B2
(45) Date of Patent: Feb. 25, 2020

(54) BALANCED TO UNBALANCED CONVERTER

(71) Applicants: Semiconductor Manufacturing International (Shanghai) Corporation, Shanghai (CN); Semiconductor Manufacturing International (Beijing) Corporation, Beijing (CN)

(72) Inventors: XiNing Wang, Shanghai (CN); JenHao Cheng, Shanghai (CN); Ling Liu, Shanghai (CN); Jin Feng Gao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 36 days.

(21) Appl. No.: 16/044,801

(22) Filed: Jul. 25, 2018

(65) Prior Publication Data
US 2019/0068157 A1   Feb. 28, 2019

(30) Foreign Application Priority Data
Aug. 31, 2017   (CN) .......................... 2017 1 0769641

(51) Int. Cl.
*H03H 7/42*        (2006.01)
*H01F 21/12*       (2006.01)
(Continued)

(52) U.S. Cl.
CPC .............. *H03H 7/42* (2013.01); *H01F 21/12* (2013.01); *H01F 27/2804* (2013.01); *H01F 2027/2809* (2013.01); *H03H 2001/0085* (2013.01)

(58) Field of Classification Search
CPC ..................................... H01P 7/42; H01P 5/10
(Continued)

(56) References Cited

U.S. PATENT DOCUMENTS

| | | | | |
|---|---|---|---|---|
| 6,396,362 B1* | 5/2002 | Mourant | ................ | H03H 7/42 333/25 |
| 8,198,970 B2* | 6/2012 | Choi | ................... | H01F 17/0013 336/200 |
| 10,374,571 B2* | 8/2019 | Wang | ....................... | H03H 7/42 |

* cited by examiner

*Primary Examiner* — Dean O Takaoka
(74) *Attorney, Agent, or Firm* — Brinks Gilson & Lione

(57) ABSTRACT

Disclosed is a balanced to unbalanced converter, which relates to the field of semiconductor technologies. The balanced to unbalanced converter includes a first spiral coil and a second spiral coil. The first spiral coil includes: multiple rings of first metal wires; and a second metal wire, which is located above the multiple rings of first metal wires and is connected to an innermost ring of the first metal wires using a conductive plug. The second spiral coil includes: multiple rings of third metal wires, adjacent third metal wires being separated by one ring of the first metal wires; and multiple rings of fourth metal wires that are located above the multiple rings of the third metal wires, each ring of the fourth metal wires being connected to one ring of the third metal wires by the conductive plug, a fourth metal wire closer to an outer ring being connected to a third metal wire closer to an outer ring, and a fourth metal wire closer to an inner ring being connected to a third metal wire closer to an inner ring. The second metal wire and the innermost ring of the first metal wires do not overlap in a vertical direction, and at least one of the multiple rings of the fourth metal wires and the third metal wire connected to the fourth metal wire do not overlap in the vertical direction.

15 Claims, 3 Drawing Sheets

(51) Int. Cl.
*H01F 27/28* (2006.01)
*H03H 1/00* (2006.01)

(58) Field of Classification Search
USPC .......................................................... 333/25
See application file for complete search history.

BALANCED TO UNBALANCED CONVERTER

RELATED APPLICATIONS

The present application claims priority to Chinese Patent Appln. No. 201710769641.7, filed Aug. 31, 2017, the entire disclosure of which is hereby incorporated by reference.

BACKGROUND

Technical Field

This application relates to the field of semiconductor technologies, and in particular, to a balanced to unbalanced converter.

Related Art

A balanced to unbalanced converter (also referred to as Balun) is a key part of a radio frequency front-end circuit. The balanced to unbalanced converter can convert an unbalanced input signal (for example, a single-ended signal) to a balanced output signal (for example, a differential signal) and convert a balanced input signal to an unbalanced output signal.

In a radio frequency integrated circuit, a typical balanced to unbalanced converter occupies a large chip area, resulting in high chip costs and limiting chip miniaturization and application. In addition, the typical balanced to unbalanced converter has a low quality factor (Q-factor) and a large insertion loss, limiting the performance improvement of integrated circuits.

To improve the quality factor and reduce the insertion loss, some designers tend to use a balanced to unbalanced converter that is separated from a chip. However, this increases the chip costs and encapsulation complexity.

To reduce the chip area occupied by the balanced to unbalanced converter, designers may use a fully stacked structure, which also lowers the quality factor and increases the insertion loss.

In addition, some designers may improve the quality factor and reduce the insertion loss by increasing a width of a coil, which further results in a small electromagnetic coupling effect and high chip area costs.

SUMMARY

An objective of this application is to provide a balanced to unbalanced converter, so as to balance both performance (for example, a low insertion loss and a high electromagnetic coupling effect) of the balanced to unbalanced converter and area costs.

In one aspect of this disclosure, a balanced to unbalanced converter is provided, including: a first spiral coil and a second spiral coil coupled to the first spiral coil. The first spiral coil includes: multiple rings of first metal wires; and a second metal wire, which is located above the multiple rings of the first metal wires and is connected to the innermost ring of the first metal wires using a conductive plug. The second spiral coil includes: multiple rings of third metal wires, where adjacent third metal wires are separated by one ring of the first metal wires; and multiple rings of fourth metal wires that are located above the multiple rings of the third metal wires, where each ring of the fourth metal wires is connected to one ring of the third metal wires by the conductive plug, a fourth metal wire closer to an outer ring is connected to a third metal wire close to an outer ring, and a fourth metal wire closer to an inner ring is connected to a third metal wire close to an inner ring. The second metal wire and the innermost ring of the first metal wires do not overlap in a vertical direction, and at least one of the multiple rings of the fourth metal wires and the third metal wire connected to the fourth metal wire do not overlap in the vertical direction.

In some implementations, a first portion of metal wires of the multiple rings of the fourth metal wires is located above a space between a first metal wire and a third metal wire that are adjacent to each other; and a second portion of fourth metal wires of the multiple rings of the fourth metal wires is located above one ring of the first metal wires.

In some implementations, one of two adjacent rings of the fourth metal wires is located above the space between the first metal wire and the third metal wire that are adjacent to each other, where the other ring of the fourth metal wires is located above one ring of the first metal wires.

In some implementations, each ring of the fourth metal wire is located above a space between a first metal wire and a third metal wire that are adjacent to each other.

In some implementations, each ring of the fourth metal wires is located above one ring of the first metal wires.

In some implementations, the second metal wire is located above the space between the first metal wire and the third metal wire that are adjacent to each other.

In some implementations, the second metal wire is located above a first metal wire adjacent to the innermost ring of the first metal wires.

In some implementations, the second metal wire is surrounded by the multiple rings of the fourth metal wires.

In some implementations, the conductive plug includes a first part and a second part perpendicular to the first part.

In some implementations, materials of the first metal wires and the third metal wires include copper.

In some implementations, materials of the second metal wire and the fourth metal wires include aluminum.

In some implementations, the multiple rings of first metal wires have three to six rings; and the multiple rings of third metal wires and the multiple rings of the fourth metal wires have two to six rings.

In some implementations, first metal wires other than the innermost ring of the first metal wires of the multiple rings of first metal wires have a width of two to ten micrometers; the innermost ring of the first metal wires has a width of one to five micrometers; the second metal wire, the third metal wires and the fourth metal wires have a width of two to ten micrometers; and a distance between a first metal wire and a third metal wire that are adjacent to each other is one to ten micrometers.

In some implementations, shapes of the first metal wires, a shape of the second metal wire, shapes of the third metal wires and shapes of the fourth metal wires include a quadrilateral, a hexagon, an octagon, or a circle.

In the balanced to unbalanced converter provided by embodiments and implementations of this application, a top metal layer and a bottom metal layer have different layouts. The second metal wire and the innermost ring of the first metal wires do not overlap in the vertical direction, and at least one ring of the fourth metal wires and the third metal wire connected to the fourth metal wire do not overlap in the vertical direction. Thus, the top metal layer and the bottom metal layer can be connected by using, for example, an L-shaped conductive plug, increasing the electromagnetic coupling effect and reducing the insertion loss. In addition, the balanced to unbalanced converter of this application occupies a smaller chip area while achieving the same performance.

Through the detailed description of exemplary embodiments and implementations of this application with reference to the following accompanying drawings, other features, aspects and advantages of this application can become more comprehensible.

BRIEF DESCRIPTION OF THE DRAWINGS

The accompanying drawings forming a part of this specification show embodiments of the present invention, and are intended to explain the principle of the present invention together with the specification. In the accompanying drawings.

DETAILED DESCRIPTION

Figure 1A:
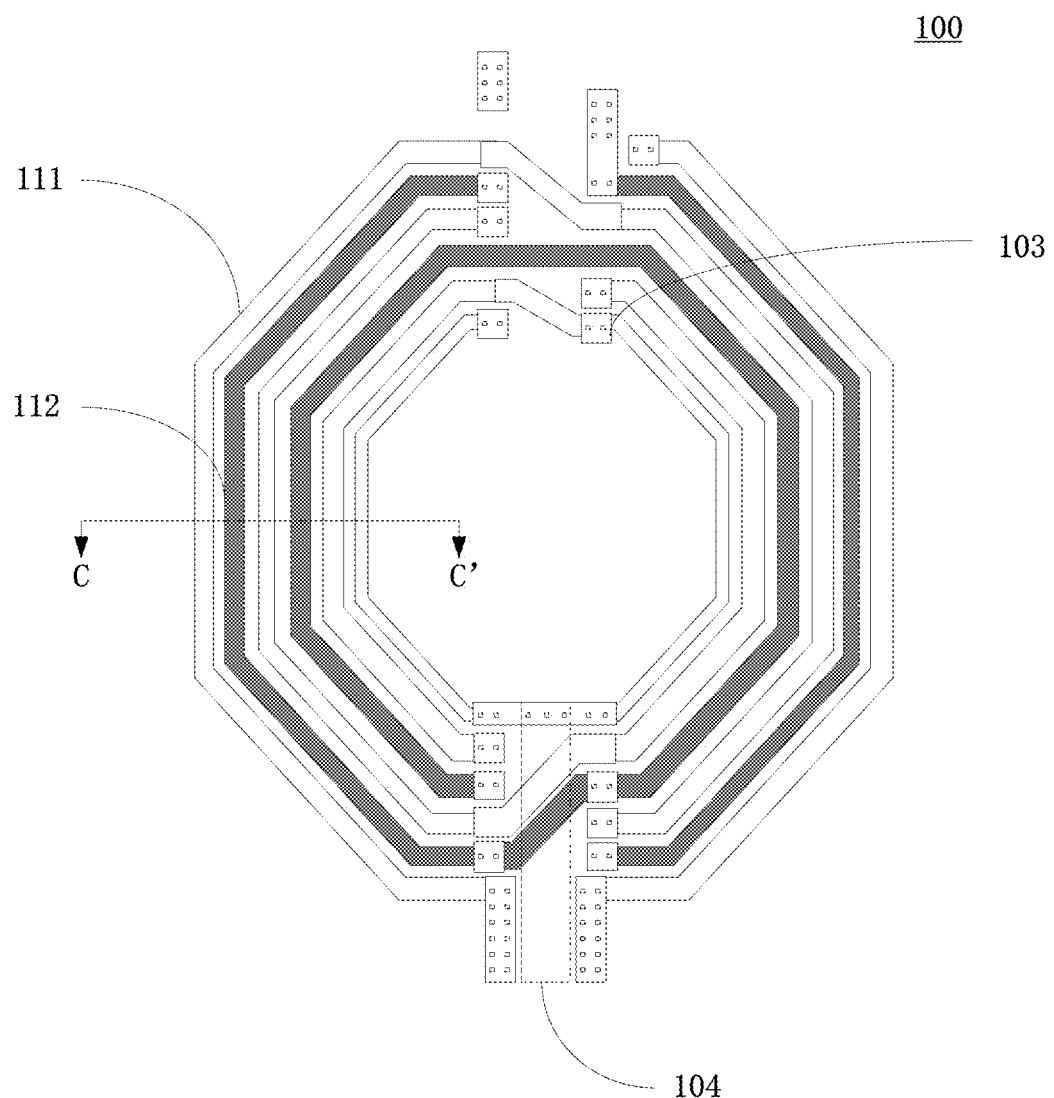
FIG. 1A is a schematic layout diagram of a bottom metal layer of a balanced to unbalanced converter.

Various exemplary embodiments and implementations of the present disclosure are now described in detail with reference to the accompanying drawings. It should be noted that unless otherwise specifically stated, the relative arrangement, numeric expression, and values of components and steps explained in these embodiments and implementations do not limit the scope of the present disclosure.

In addition, it should be understood that for ease of description, the sizes of parts shown in the accompanying drawings are not drawn according to actual proportional relationships. For example, the thickness or the width of some layers can be exaggerated relative to other layers.

The following description of at least one exemplary embodiment is merely illustrative, and by no means imposes any limitation to the present invention and application or use thereof.

Technologies, methods, and devices known by a person of ordinary skill in the art may not be discussed in detail, but when appropriate, the technologies, the methods, and the devices should be considered as a part of this specification.

It should be noted that similar reference numerals and characters represent similar items in the accompanying drawings below. Therefore, once an item is defined in one figure, the item does not need to be further discussed in the subsequent figures.

A balanced to unbalanced converter provided by embodiments and implementations of this disclosure includes a bottom metal layer and a top metal layer located above the bottom metal layer and substantially parallel to the bottom metal layer. A dielectric layer may be provided between the bottom metal layer and the top metal layer. A metal plug may be formed in the dielectric layer, and the metal plug is used for connecting the bottom metal layer and the top metal layer.

Figure 1B:
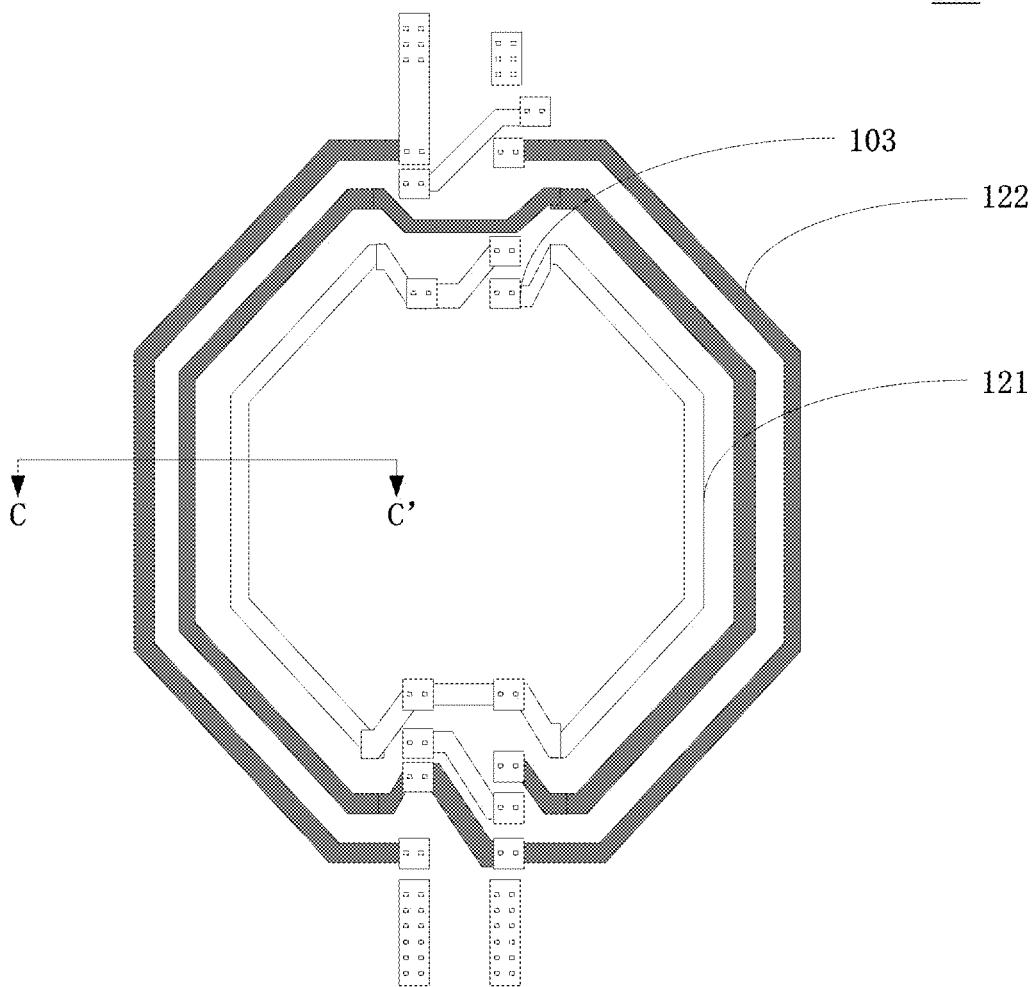
FIG. 1B is a schematic layout diagram of a top metal layer of a balanced to unbalanced converter.
Figure 1C:
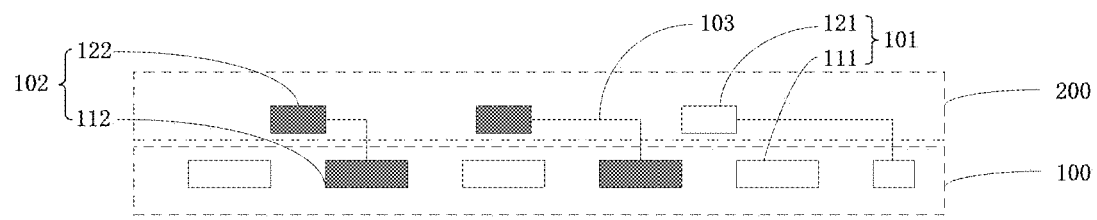
FIG. 1C is a schematic cross-sectional diagram along a line C-C' in FIG. 1A and FIG. 1B.

FIG. 1A is a schematic layout diagram of a bottom metal layer 100 of a balanced to unbalanced converter. FIG. 1B is a schematic layout diagram of a top metal layer 200 of a balanced to unbalanced converter. FIG. 1C is a schematic cross-sectional diagram along a line C-C' in FIG. 1A and FIG. 1B.

Referring to FIG. 1A, FIG. 1B and FIG. 1C, the balanced to unbalanced converter includes a first spiral coil 101 and a second spiral coil 102 coupled to the first spiral coil 101.

The first spiral coil 101 includes multiple rings (at least two rings) of first metal wires 111 located on the bottom metal layer 100 and one ring of a second metal wire 121 located on the top metal layer 200. The second metal wire 121 is connected to the innermost ring of the first metal wires 111 by using a conductive plug 103. A center tap 104 (as shown in FIG. 1A) can be provided in the middle of first metal wires 111, and be configured to be connected to ground. Materials of the first metal wires 111 may include copper, and materials of the second metal wire 121 may include aluminum.

The multiple rings of the first metal wires 111 may include two parts connected to each other. A first part spirals inward from outward and is connected to a second part, and the second part spirals outward from inward. The first part and the second part may be symmetrical to one another. The first part and the second part may each include multiple connected segments. Two connected segments in the first part and two connected segments in the second part can be connected using a metal bridge built in the bottom metal layer, or can be connected using a conductive plug and a metal bridge built in the top metal layer.

In some implementations, multiple rings of first metal wires may have three to six rings, for example, four rings and five rings. FIG. 1A, FIG. 1B and FIG. 1C schematically show four rings of the first metal wires 111. The innermost ring of the first metal wires 111 may have a width of one to five micrometers, for example, two micrometers and three micrometers. Other first metal wires 111, except for the innermost ring of the first metal wires 111 and a second metal wire 121, may have a width of two to ten micrometers, for example, three micrometers, four micrometers and six micrometers.

The second spiral coil 102 includes multiple rings of third metal wires 112 located on the bottom metal layer 100 and multiple rings of fourth metal wires 122 located on the top metal layer 200. A material of the third metal wires 112 may include copper, and a material of the fourth metal wires 122 may include aluminum. In some implementations, multiple rings of third metal wires 112 and multiple rings of fourth metal wires 122 may have two to six rings, for example, three rings and four rings. FIG. 1A, FIG. 1B and FIG. 1C schematically show two rings of the third metal wires 112 and two rings of the fourth metal wires 122. In addition, the third metal wires 112 and the fourth metal wires 122 may have a width of two to ten micrometers, for example, three micrometers, four micrometers and six micrometers.

Similar to the multiple rings of the first metal wires 111, the multiple rings of the third metal wires 112 and the multiple rings of the fourth metal wires 122 may also each include two parts connected to each other. A first part spirals inward from outward and is connected to a second part, and the second part spirals outward from inward. The first part and the second part may also each include multiple connected segments. For the connecting manner of two adjacent segments, reference may be made to the preceding description, and details are not described again here.

In the second spiral coil 102, adjacent third metal wires 112 are separated by one ring of the first metal wires 111 (as shown in FIG. 1A and FIG. 1C). As an example, the distance between a first metal wire 111 and a third metal wire 112 that are adjacent to each other may be one to ten micrometers, for example, two micrometers, four micrometers and six micrometers.

In the second spiral coil 102, each ring of the fourth metal wires 122 is connected to one ring of the third metal wires 112 by using the conductive plug 103. Specifically, a fourth metal wire 122 closer to an outer ring is connected to a third metal wire 112 closer to an outer ring, and a fourth metal wire 122 closer to an inner ring is connected to a third metal wire 112 closer to an inner ring. For example, referring to FIG. 10, a fourth metal wire 122 on the left is connected to a third metal wire 112 on the left, and a fourth metal wire 122 on the right is connected to a third metal wire 112 on the right.

In the foregoing balanced to unbalanced converter, the second metal wire 121 and the innermost ring of the first metal wires 111 do not overlap in a vertical direction, that is, they are not aligned. In some implementations, a second metal wire 121 may be surrounded by multiple rings of fourth metal wires 122, that is, viewed from the top metal layer 200, the second metal wire 121 is the innermost metal wire, as shown in FIG. 1B.

In addition, at least one of the multiple rings of the fourth metal wires 122 and a third metal wire 112 connected to the fourth metal wire 122 do not overlap in the vertical direction. For example, only the fourth metal wire 122 on the left and the third metal wire 112 on the left do not overlap in the vertical direction; for another example, only the fourth metal wire 122 on the right and the third metal wire 112 on the right do not overlap in the vertical direction; for another example, the fourth metal wire 122 on the left and the third metal wire 112 on the left do not overlap in the vertical direction, and the fourth metal wire 122 on the right and the third metal wire 112 on the right do not overlap in the vertical direction.

When in operation, the first spiral coil 101 can be configured to receive a differential signal and produce a single-ended signal in the second spiral coil 102 through electromagnetic coupling, so as to convert the differential signal to the single-ended signal. In addition, the second spiral coil 102 can be configured to receive a single-ended signal and produce a differential signal in the first spiral coil 101 through electromagnetic coupling, so as to convert the single-ended signal to the differential signal.

It should be noted that, though FIG. 1A and FIG. 1B show that the shapes of the first metal wires 111, the second metal wire 121, the third metal wires 112 and the fourth metal wires 122 are an octagon, it should be understood that, this is only illustrative. In other implementations, the shapes of the first metal wires 111, the second metal wire 121, the third metal wires 112 and the fourth metal wires 122 may also be a quadrilateral, a hexagon, or a circle.

Some specific implementations of the balanced to unbalanced converter are described below.

In an implementation, each ring of multiple rings of the fourth metal wires 122 may be located above a space between one ring of the first metal wires 111 and one ring of the third metal wires 112 which are adjacent to each other (see the fourth metal wire 122 on the left in FIG. 1C), so as to increase the electromagnetic coupling effect. Similarly, the second metal wire 121 may be located above a space between a first metal wire 111 and a third metal wire 112 that are adjacent to each other.

In another implementation, each ring of multiple rings of the fourth metal wires 122 may be located above one ring of the first metal wires 111 (see the fourth metal wire 122 on the right in FIG. 1C). Similarly, the second metal wire 121 may be located above a first metal wire 111 that is adjacent to the innermost ring of the first metal wires 111.

In still another implementation, a first portion of fourth metal wires 122 of the multiple rings of the fourth metal wires 122 may be located above a space between a first metal wire 111 and a third metal wire 112 that are adjacent to each other, and a second portion of fourth metal wires 122 of the multiple rings of the fourth metal wires 122 may be located above one ring of the first metal wires 111. Compared with the two implementations above, this implementation can realize a larger electromagnetic coupling effect and less insertion loss.

To further reduce the insertion loss, in some implementations, one of two adjacent rings of the fourth metal wires 122 may be located above a space between a first metal wire 111 and a third metal wire 112 that are adjacent to each other, and the other ring of the fourth metal wires 122 may be located above one ring of the first metal wires 111. For example, as shown in FIG. 1C, the fourth metal wire 122 closer to an outer ring is located above the space between the first metal wire 111 and the third metal wire 112 that are adjacent to each other, and the fourth metal wire 122 closer to an inner ring is located above one ring of the first metal wires 111.

In some implementations, the conductive plug 103 may include a horizontal part and a vertical part that are connected to each other such that the conductive plug 103 may be L-shaped. The horizontal part may be connected to the top metal layer 200, for example, the second metal wire 121 or the fourth metal wires 122; the vertical part may be connected to the bottom metal layer 100, for example, the first metal wires 111 or the third metal wires 112. The L-shaped conductive plug can reduce parasitic capacitance and increase the electromagnetic coupling effect.

Figure 2:
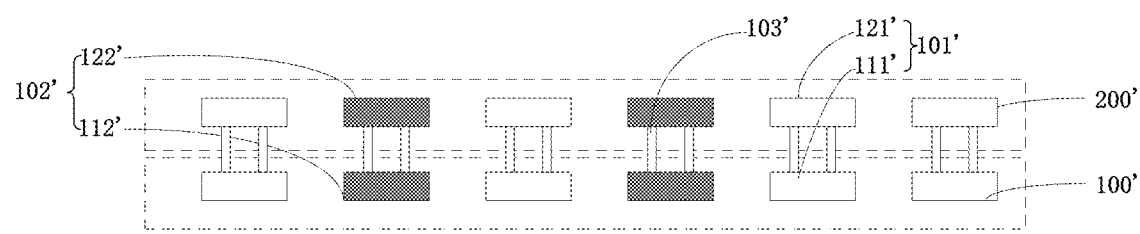
FIG. 2 is a schematic cross-sectional diagram of a part of an existing balanced to unbalanced converter.

FIG. 2 is a schematic cross-sectional diagram of a part of an existing balanced to unbalanced converter. As shown in FIG. 2, a bottom metal layer 100' and a top metal layer 200' of the existing balanced to unbalanced converter have the same layout. First metal wires 111' of a first spiral coil 101' are aligned with a second metal wire 121' in the vertical direction, and the first metal wires 111' are connected to the second metal wire 121' below the first metal wires 111' by using a conductive plug 103'. Third metal wires 112' of a second spiral coil 102' are aligned with fourth metal wires 122' in the vertical direction, and the third metal wires 112' are connected to the fourth metal wires 122' below the third metal wires 112' by using the conductive plug 103'.

Figure 3:
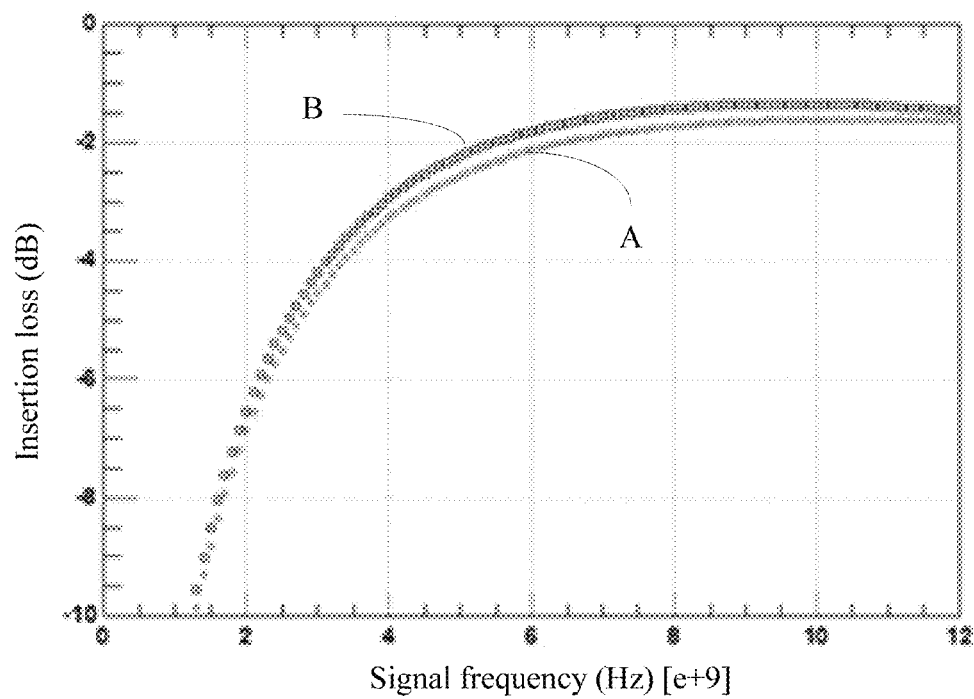
FIG. 3 is a schematic diagram illustrating changes of insertion losses of a balanced to unbalanced converter in this application and of an existing balanced to unbalanced converter with a signal frequency.

FIG. 3 is a schematic diagram illustrating change of insertion losses of some implementations of a balanced to unbalanced converter described in the present application and of an existing balanced to unbalanced converter with a signal frequency. In FIG. 3, a curve A represents the change of the insertion loss of the existing balanced to unbalanced converter with the signal frequency, and a curve B represents the change of the insertion loss of the balanced to unbalanced converter in this application with the signal frequency. It can be seen from FIG. 3 that, an absolute value of the insertion loss of implementations of the balanced to unbalanced converter described in this application is smaller than an absolute value of the insertion loss of the existing balanced to unbalanced converter.

In addition, in the existing balanced to unbalanced converter in FIG. 2, the bottom metal layer and the top metal layer have the same layout, and the electromagnetic coupling effect will be reduced if the width of metal wires is reduced. However, in implementations of the balanced to unbalanced converter provided by this application, the top metal layer and the bottom metal layer have different layouts. The second metal wire and the innermost ring of the first metal wires do not overlap in the vertical direction, and at least a ring of the fourth metal wire and the third metal wire connected to the fourth metal wire do not overlap in the vertical direction, so that the top metal layer and the bottom metal layer can be connected by using the L-shaped conductive plug. The electromagnetic coupling effect will not be reduced even if the width of metal wires is reduced. Therefore, the balanced to unbalanced converter of this application occupies a smaller chip area while achieving the same performance.

As an example, compared with the existing balanced to unbalanced converter, the balanced to unbalanced converter of this application occupies about 29% smaller chip area, the insertion loss of the balanced to unbalanced converter of this application is reduced by about 12.5% and an electromagnetic coupling coefficient is increased by about 5%. As for a quality factor, for example, a single-end maximum quality factor and a differential maximum quality factor are basically the same as those in the existing technology.

Balanced to unbalanced converters according to the embodiments and implementations of this application are described above in detail. To avoid obstructing concepts of this application, some well-known details in the art are not described. According to the foregoing description, those skilled in the art will understand how to implement the technical solutions disclosed herein. In addition, the embodiments and implementations disclosed by the specification can be combined freely. Those skilled in the art should understand that, various modifications can be made to the embodiments illustrated above without departing from the spirit and scope of this application limited by the appended claims.

What is claimed is:

1. A balanced to unbalanced converter, comprising:
   a first spiral coil, comprising:
      multiple rings of first metal wires; and
      a second metal wire, located above the multiple rings of first metal wires, and connected to an innermost ring of the first metal wires using a conductive plug; and
   a second spiral coil, coupled to the first spiral coil, comprising:
      multiple rings of third metal wires, where adjacent third metal wires are separated by one ring of the first metal wires; and
      multiple rings of fourth metal wires, located above the multiple rings of the third metal wires, where each ring of the fourth metal wires is connected to one ring of the third metal wires by a conductive plug, and a fourth metal wire closer to an outer ring is connected to a third metal wire closer to an outer ring, and a fourth metal wire closer to an inner ring is connected to a third metal wire closer to an inner ring,
   wherein the second metal wire and the innermost ring of the first metal wires do not overlap in a vertical direction, and wherein at least one ring of the multiple rings of the fourth metal wires and the third metal wire connected to the fourth metal wire do not overlap in the vertical direction.

2. The balanced to unbalanced converter according to claim 1, wherein:
   a first portion of fourth metal wires of the multiple rings of the fourth metal wires is located above a space between a first metal wire and a third metal wire that are adjacent to each other; and
   a second portion of fourth metal wires of the multiple rings of the fourth metal wires is located above one ring of the first metal wires.

3. The balanced to unbalanced converter according to claim 2, wherein:
   one of two adjacent rings of the fourth metal wires is located above a space between the first metal wire and the third metal wire that are adjacent to each other, and the other ring of the fourth metal wires is located above one ring of the first metal wires.

4. The balanced to unbalanced converter according to claim 1, wherein each ring of the multiple rings of fourth metal wires is located above a space between a first metal wire and a third metal wire that are adjacent to each other.

5. The balanced to unbalanced converter according to claim 1, wherein each ring of the multiple rings of fourth metal wires is located above one ring of the first metal wires.

6. The balanced to unbalanced converter according to claim 1, wherein the second metal wire is located above a space between the first metal wire and the third metal wire that are adjacent to each other.

7. The balanced to unbalanced converter according to claim 1, wherein the second metal wire is located above a first metal wire adjacent to the innermost ring of the first metal wires.

8. The balanced to unbalanced converter according to claim 1, wherein the second metal wire is surrounded by the multiple rings of fourth metal wires.

9. The balanced to unbalanced converter according to claim 1, wherein, the conductive plug comprises a first part and a second part perpendicular to the first part.

10. The balanced to unbalanced converter according to claim 1, wherein, materials of the first metal wires and the third metal wires comprise copper.

11. The balanced to unbalanced converter according to claim 10, wherein, materials of the second metal wire and the fourth metal wires comprise aluminum.

12. The balanced to unbalanced converter according to claim 1, wherein, material of the second metal wire and the fourth metal wire comprise aluminum.

13. The balanced to unbalanced converter according to claim 1, wherein:
   the multiple rings of first metal wires have three to six rings; and
   the multiple rings of third metal wires and the multiple rings of fourth metal wires have two to six rings.

14. The balanced to unbalanced converter according to claim 1, wherein:
   first metal wires other than the innermost ring of first metal wires of the multiple rings of first metal wires have a width of two to ten micrometers;
   the innermost ring of the first metal wires has a width of one to five micrometers;
   the second metal wire, the third metal wires and the fourth metal wires have a width of two to ten micrometers; and
   a distance between a first metal wire and a third metal wire that are adjacent to each other is one to ten micrometers.

15. The balanced to unbalanced converter according to claim 1, wherein, shapes of the first metal wires, a shape of the second metal wire, shapes of the third metal wires and shapes of the fourth metal wires comprise a quadrilateral, a hexagon, an octagon, or a circle.

\* \* \* \* \*